(12) United States Patent
Tamlyn et al.

(10) Patent No.: US 8,913,448 B2
(45) Date of Patent: Dec. 16, 2014

(54) APPARATUSES AND METHODS FOR CAPTURING DATA IN A MEMORY

(71) Applicant: Micron Technology, Inc., Boise, ID (US)

(72) Inventors: Robert Tamlyn, Meridian, ID (US); Debra M. Bell, Dallas, TX (US); Michael Roth, Boise, ID (US); Eric A. Becker, Boise, ID (US); Tyrel Z. Jensen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 92 days.

(21) Appl. No.: 13/660,768

(22) Filed: Oct. 25, 2012

(65) Prior Publication Data

US 2014/0119141 A1    May 1, 2014

(51) Int. Cl.
*G11C 7/00* (2006.01)
(52) U.S. Cl.
USPC ........................ 365/193; 365/194; 365/189.05
(58) Field of Classification Search
CPC ........ G11C 7/22; G11C 7/222; G11C 7/1051; G11C 29/02; G11C 29/022
USPC ................ 365/193, 194, 189.05, 189.15, 191
See application file for complete search history.

(56) References Cited

U.S. PATENT DOCUMENTS

| | | | |
|---|---|---|---|
| 5,004,933 A | 4/1991 | Widener | |
| 6,111,810 A | 8/2000 | Fujita | |
| 6,219,384 B1 | 4/2001 | Kliza et al. | |
| 6,260,128 B1 | 7/2001 | Ohshima et al. | |
| 6,275,077 B1 | 8/2001 | Tobin et al. | |
| 6,424,592 B1 | 7/2002 | Maruyama | |
| 6,438,055 B1 | 8/2002 | Taguchi et al. | |
| 6,459,313 B1 | 10/2002 | Godbee et al. | |
| 6,489,823 B2 | 12/2002 | Iwamoto | |
| 6,510,095 B1 | 1/2003 | Matsuzaki et al. | |
| 6,636,110 B1 | 10/2003 | Ooishi et al. | |
| 6,687,185 B1 | 2/2004 | Keeth et al. | |
| 6,710,726 B2 | 3/2004 | Kim et al. | |
| 6,744,285 B2 | 6/2004 | Mangum et al. | |
| 6,781,861 B2 | 8/2004 | Gomm et al. | |
| 6,839,288 B1 | 1/2005 | Kim et al. | |

(Continued)

FOREIGN PATENT DOCUMENTS

CN          101752009 A      6/2010

OTHER PUBLICATIONS

"Interfacing DDR SDRAM with Stratix II Devices", Version 3.2, Altera Corp, Sep. 2008.

(Continued)

*Primary Examiner* — Gene Auduong
(74) *Attorney, Agent, or Firm* — Dorsey & Whitney LLP

(57) ABSTRACT

Apparatuses and methods for capturing data in a memory are disclosed herein. An apparatus may include a command path and a data capture logic. The command path may be configured to receive a command signal and to delay the command signal with a delay based, at least in part, on a plurality of propagation delays. The data capture logic may be coupled to the command path and configured to receive the delayed command signal and a data strobe signal. The data capture logic may further be configured to capture data according to the data strobe signal responsive, at least in part, to receipt of the delayed command signal.

23 Claims, 5 Drawing Sheets

(56) References Cited

U.S. PATENT DOCUMENTS

| | | |
|---|---|---|
| 6,861,901 B2 | 3/2005 | Prexl et al. |
| 6,914,798 B2 | 7/2005 | Kwon et al. |
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 * | 7/2007 | Shin ............ 365/194 |
| 7,268,605 B2 | 9/2007 | Fang et al. |
| 7,269,754 B2 | 9/2007 | Ramaswamy et al. |
| 7,280,430 B2 | 10/2007 | Lee |
| 7,336,752 B2 | 2/2008 | Vlasenko et al. |
| 7,340,632 B2 | 3/2008 | Park |
| 7,375,560 B2 | 5/2008 | Lee et al. |
| 7,411,852 B2 | 8/2008 | Nishioka et al. |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,698,589 B2 * | 4/2010 | Huang ............ 713/401 |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,822,904 B2 * | 10/2010 | LaBerge ............ 710/310 |
| 7,826,305 B2 | 11/2010 | Fujisawa |
| 7,826,583 B2 | 11/2010 | Jeong et al. |
| 7,872,924 B2 | 1/2011 | Ma |
| 7,885,365 B2 | 2/2011 | Hagleitner et al. |
| 7,913,103 B2 | 3/2011 | Gold et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,983,094 B1 | 7/2011 | Roge et al. |
| 8,004,884 B2 | 8/2011 | Franceschini et al. |
| 8,018,791 B2 | 9/2011 | Kwak |
| 8,030,981 B2 | 10/2011 | Kim |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,441,888 B2 | 5/2013 | Bringivijayaraghavan et al. |
| 8,509,011 B2 * | 8/2013 | Bringivijayaraghavan ... 365/194 |
| 8,644,096 B2 * | 2/2014 | Bringivijayaraghavan ... 365/194 |
| 8,788,896 B2 | 7/2014 | Tekumalla |
| 2001/0015924 A1 | 8/2001 | Arimoto et al. |
| 2002/0057624 A1 | 5/2002 | Manning |
| 2003/0117864 A1 | 6/2003 | Hampel et al. |
| 2005/0024107 A1 | 2/2005 | Takai et al. |
| 2005/0132043 A1 | 6/2005 | Wang et al. |
| 2005/0270852 A1 | 12/2005 | Dietrich et al. |
| 2006/0062341 A1 | 3/2006 | Edmondson et al. |
| 2006/0155948 A1 | 7/2006 | Ruckerbauer |
| 2006/0182212 A1 | 8/2006 | Hwang et al. |
| 2007/0033427 A1 | 2/2007 | Correale, Jr. et al. |
| 2007/0088903 A1 | 4/2007 | Choi |
| 2007/0192651 A1 | 8/2007 | Schoch |
| 2008/0080267 A1 | 4/2008 | Lee |
| 2008/0080271 A1 | 4/2008 | Kim |
| 2008/0082707 A1 | 4/2008 | Gupta et al. |
| 2008/0144423 A1 | 6/2008 | Kwak |
| 2009/0232250 A1 | 9/2009 | Yamada et al. |
| 2009/0315600 A1 | 12/2009 | Becker et al. |
| 2010/0001762 A1 | 1/2010 | Kim |
| 2010/0066422 A1 | 3/2010 | Tsai |
| 2010/0124090 A1 | 5/2010 | Arai |
| 2010/0124102 A1 | 5/2010 | Lee et al. |
| 2010/0165769 A1 | 7/2010 | Kuroki |
| 2010/0165780 A1 | 7/2010 | Bains et al. |
| 2010/0195429 A1 | 8/2010 | Sonoda |
| 2010/0199117 A1 | 8/2010 | Kwak |
| 2010/0232213 A1 * | 9/2010 | Hwang et al. ............ 365/149 |
| 2010/0254198 A1 | 10/2010 | Bringivijayaraghavan et al. |
| 2011/0055671 A1 | 3/2011 | Kim et al. |
| 2011/0228625 A1 | 9/2011 | Bringivijayaraghavan |
| 2011/0238866 A1 | 9/2011 | Zitlaw |
| 2011/0238941 A1 | 9/2011 | Xu et al. |
| 2011/0298512 A1 | 12/2011 | Kwak |
| 2011/0314324 A1 | 12/2011 | Ozdemir |
| 2012/0084575 A1 | 4/2012 | Flores et al. |
| 2012/0124317 A1 | 5/2012 | Mirichigni et al. |
| 2012/0254873 A1 | 10/2012 | Bringivijayaraghavan |
| 2012/0269015 A1 | 10/2012 | Bringivijayaraghavan |
| 2013/0194013 A1 | 8/2013 | Kwak |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0258764 A1 | 9/2014 | Kwak |

OTHER PUBLICATIONS

Lee, "How to Implement DDR SGRAM in Graphic System", Samsung Electric, 1998.

First Office action dated May 20, 2014 received for TW Application No. 101109756.

International Search Report & Written Opinion for Appl No. PCT/US2013/066949 mailed Feb. 14, 2014.

International Search Report & Written Opinion for PCT/US/2013/066947 mailed Feb. 10, 2014.

* cited by examiner

APPARATUSES AND METHODS FOR CAPTURING DATA IN A MEMORY

TECHNICAL FIELD

Embodiments of the present invention relate generally to semiconductor memory, and more specifically, in one or more described embodiments, to the timing of internal clock, data, and command signals for capturing data in a memory.

BACKGROUND

In semiconductor memory, proper operation of the memory is based on the correct timing of various internal command and clock signals. For example, in writing data to memory internal clock signals that clock data path circuitry to capture write data may need to be provided with specific timing relationships with internal write command signals to properly enable the data path circuitry to provide the captured write data for writing to memory. Inaccurate timing of the internal command and clock signals could result in the write command being inadvertently ignored or incorrect write data being provided to the memory may (e.g., the write data is associated with another write command). Likewise, in reading data from the memory, internal clock signals that clock data block circuitry to provide the read data may need to be provided substantially concurrently with internal read command signals to properly enable the data block circuitry to output the read data. If the timing of the internal read command signal is not such that the data block circuitry is enabled at the time the internal clock signal clocks the data block circuitry to output the read data at an expected time, the read command may be inadvertently ignored or the read data provided by the memory may not be correct (i.e., the data associated with another read command).

Complicating the generation of correctly timed internal clock and command signals is the relatively high frequency of memory clock signals. For example, memory clock signals can exceed 1 GHz. Further complicating the matter is that multi-data rate memories may provide and receive data at a rate higher than the memory clock signal, which may represent the rate at which commands may be executed. As a result, the timing domains of command and clock signals may need to be crossed in order to maintain proper timing.

DETAILED DESCRIPTION

Apparatuses and methods for capturing data in a memory are disclosed herein. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
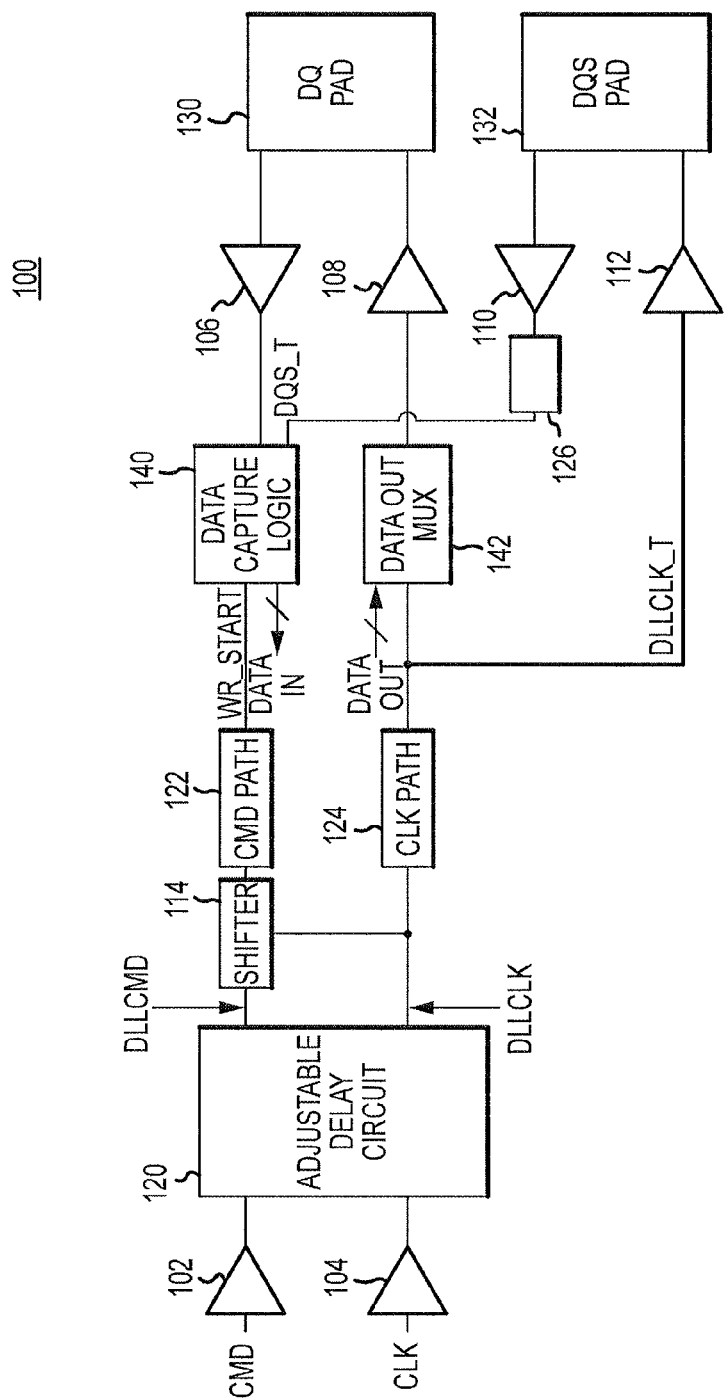
FIG. 1 is a block diagram of an apparatus including a command path according to an embodiment of the invention.

FIG. 1 illustrates a block diagram of an apparatus 100 according to an embodiment of the invention. The apparatus includes input buffers 102, 104, an adjustable delay circuit 120, a shifter 114, a command path 122, and a clock path 124. The input buffers 102, 104 may be coupled to the adjustable delay circuit 120, and further may be configured to receive a command signal CMD and a clock signal CLK, respectively. The input buffers 102, 104 may be any input buffer as known in the art and will not be discussed further in the interest of brevity. The command signal CMD may be any command signal, such as a write command signal, or may be any other type of command signal, such as on-die termination command signal or a read command signal. The clock signal CLK may be a periodic signal having any frequency and duty cycle. The command signal CMD and the clock signal CLK may be provided to the input buffers 102, 104, respectively, by an external device, such as a memory controller (not shown).

The adjustable delay circuit 120 may be configured to receive the buffered CMD and CLK signals from the input buffers 102, 104. The adjustable delay circuit 120 may be configured to delay the buffered command signal CMD to provide a command signal DLLCMD and to delay the buffered clock signal CLK to provide a clock signal DLLCLK. Both the command signal CMD and clock signal CLK may be delayed, for instance, by an amount suitable to substantially synchronize an operation to the clock signal CLK. In one embodiment, for example, this delay may be an amount to account for the propagation delay of a forward clock path, that is, the propagation delay incurred between the adjustable delay circuit 120 and a DQ pad 130 of the apparatus 100 (e.g., propagation delay of the clock path 124, a data multiplexer out 142, and a data output driver 108). In at least one embodiment, the adjustable delay circuit 120 may delay the CMD and CLK signals to provide signals DLLCMD and DLLCLK using a delay-locked loop (DLL), although it will be appreciated by those having ordinary skill in the art that other circuits may be used as well.

The shifter 114 may be coupled to the adjustable delay circuit 120 and configured to receive the command signal DLLCMD and the clock signal DLLCLK therefrom. The shifter 114 may be configured to delay DLLCMD based, at least in part, on DLLCLK and in at least one embodiment, may delay DLLCMD based on a number of clock cycles of DLLCLK needed to satisfy a programmable latency, for example, CAS latency and CAS write latency. By way of example, the shifter 114 may delay the command signal DLLCMD by a number of cycles of the clock signal DLLCLK best matching the programmable latency. The number of cycles to delay DLLCMD may be stored in the shifter 114, or may be provided to the shifter 114 as an N-count control signal (not shown), for instance, by a memory controller or the adjustable delay circuit 120. In this manner, the shifter 114 may be configured to statically or dynamically delay the command signal DLLCMD.

The shifted command signal DLLCMD may be received by the command path 122 from the shifter 114 and delayed to provide a command signal WR_START. The delay of the command path 122 may model both a propagation delay of a DQS input path and the propagation delay of the forward clock path. The propagation delay of the DQS input path may, for example, be the propagation delay of providing a signal, such as a data strobe signal DQS, from the DQS pad 132 to the data capture logic 140 (e.g., propagation delay of the DQS input buffer 110 and the DQS input distribution tree 126). The command path 122 may include a signal distribution tree (not shown) to distribute WR_START to one or more circuits that may rely on WR_START to operate. The clock signal DLLCLK may be received by the clock path 124. The clock path 124 may include a signal distribution tree (not shown) to distribute the clock signal DLLCLK as a clock signal DLLCLK_T to one or more circuits that may rely on DLLCLK_T to operate, such as the data out multiplexer 142 and a DQS output driver 112.

The apparatus 100 may further include a data input buffer 106, a data output driver 108, a DQS input driver 110, a DQS output driver 112, a DQS input distribution tree 126, a data capture logic 140, and a data out multiplexer 142. The input buffers 106, 108 and the output drivers 110, 112 may be any input buffers and output drivers known in the art, now or in the future, and will not be discussed further in the interest of brevity. The data input buffer 106 may be coupled to the DQ pad 130 and the data capture logic 140 and may be configured to provide data, such as write data, from the DQ pad 130 to the data capture logic 140. Data may be provided to the DQ pad 130 according to a strobe signal DQS. The data output driver 108 may be coupled to the data out multiplexer 142 and the DQ pad 130, and may be configured to provide (e.g., output, drive, generate, apply, etc.) data received from the data out multiplexer 142 to the DQ pad 130. The data out multiplexer 142 may be configured to provide data to the output driver 108 according to the clock signal DLLCLK_T provided by the clock path 124.

The DQS input buffer 110 may be coupled to the DQS input distribution tree 126 and the DQS pad 132 and may be configured to provide the data strobe signal DQS from the DQS pad 132 to the DQS input distribution tree 126. The DQS input distribution tree 126 may be used to distribute the data strobe signal DQS as a data strobe signal DQS_T, to one or more circuits that rely on DQS to operate, such as the data capture logic 140. The DQS output driver 112 may be configured to receive the clock signal DLLCLK_T from the clock path 124 and provide DLLCLK_T to the DQS pad 132.

While the described operation of components of FIG. 1 may apply to a write command, it will be appreciated that various components of the apparatus 100, such as the data out multiplexer 142, may be used during a read operation. Additionally, other control logic (not shown in FIG. 1) may be included in the apparatus 100, for instance, to determine when the output drivers 108, 112 may provide signals to the DQ pad 130 and DQS pad 132, respectively, during a read operation.

The data capture logic 140 may comprise one or more logic circuits, control logic, logic gates, and/or any combination or sub-combination of the same. As described, the data capture logic 140 may receive signals WR_START and DQS_T from the command path 122 and the DQS input distribution tree 126, respectively. As will be explained in more detail below, based, at least in part, on the WR_START and DQS_T signals, the data capture logic 140 may capture (e.g., latch) data, such as write data, from the data input buffer 106. The captured data may subsequently be provided to a memory array (not shown).

In an example operation of the apparatus 100, the command signal CMD and clock signal CLK may be provided to the input buffers 102, 104, respectively. The adjustable delay circuit 120 may delay the CMD and CLK signals to provide signals DLLCMD and DLLCLK. Signals CMD and CLK may be delayed, for instance, based on the propagation delay of the forward clock path. As previously explained, this delay may account for the propagation delays of the clock path 124, the data out multiplexer 142, the data output driver 108, or any combination thereof. The shifter 114 may receive the DLLCMD and DLLCLK signals and may delay DLLCMD by a number of cycles of DLLCLK that may, for instance, correspond to a programmable latency. The command path 122 may receive and delay the shifted DLLCMD to provide a command signal WR_START. The command path 122 may include model delays which model the propagation delays of the forward clock path and the DQS input path.

In providing the DQS strobe signal to the DQS distribution tree, the DQS strobe signal may be provided to one or more circuits that rely on the DQS strobe signal to operate, including the data capture logic 140. Moreover, the data capture logic 140 may receive the command signal WR_START from the command path 122. Based, at least in part, on the DQS_T and WR_START signals, the data capture logic 140 may capture data provided by the data input buffer 106. As will be explained in more detail below, the command signal WR_START may identify a first valid edge of the DQS_T signal, and in response, the data capture logic 140 may capture data on each edge of the strobe signal DQS_T. The data captured may, for instance, correspond to the command signal CMD provided to the input buffer 102. By delaying the command signal CMD to provide the command signal WR_START, the command signal CMD may be provided to the apparatus 100 before corresponding data is applied to the DQ pad 130 and captured by the data capture logic 140. In this manner, data corresponding to a particular command signal may be properly captured by the data capture logic 140 despite that the data and command signal are not received by the apparatus 100 simultaneously.

In some embodiments, the data capture logic 140 may capture data until a complete write burst has been captured. In other embodiments, a WR_LAST control signal (not shown) may be generated to identify the last valid edge of the DQS_T signal, and the data capture logic 140 may stop capturing data responsive to the WR_LAST control signal. The WR_LAST control signal may be generated by the data capture logic 140 or may be provided by another device, such as a memory controller (not shown). Accordingly, in some embodiments the WR_START and WR_LAST signals may be used to control the manner in which the data capture logic 140 captures data. As described, captured data may be provided from the data capture logic 140 to a memory array.

Figure 2:
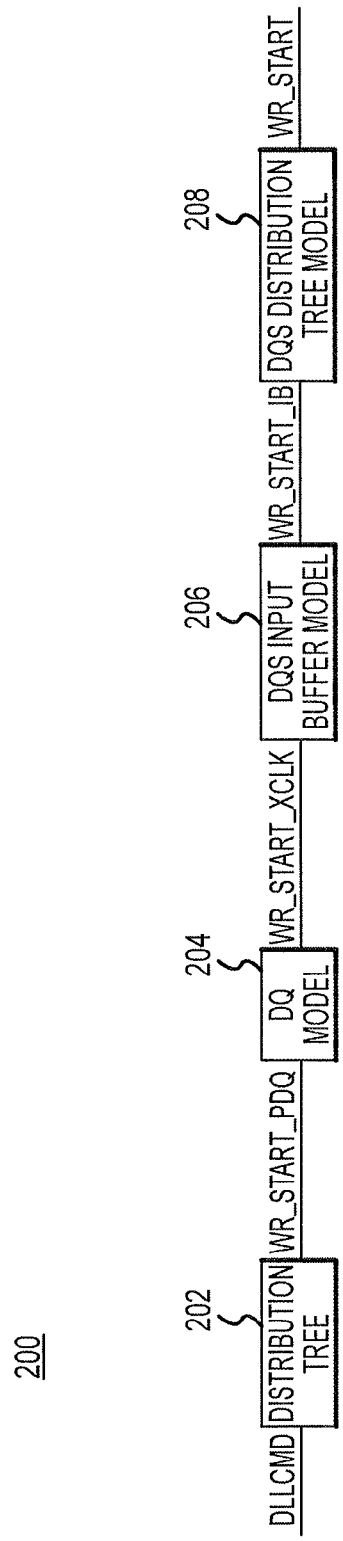
FIG. 2 is a block diagram of a command path according to an embodiment of the invention.

FIG. 2 illustrates a block diagram of a command path 200 according to an embodiment of the invention. The command path 200 may be used to implement the command path 122 of FIG. 1. The command path 200 may include a distribution tree 202, a DQ model 204, a DQS input buffer model 206, and a DQS input distribution tree model 208.

The distribution tree 202 may be coupled to the DQ model 204 and may be configured to receive the command signal DLLCMD, for instance, from the shifter 114 of FIG. 1. The distribution tree 202 may provide a delayed DLLCMD signal, WR_START_PDQ, to the DQ model 204. The delay provided by the distribution tree 202 may be the inherent propagation delay of the distribution tree 202, and in some embodiments, may be substantially the same as the propagation delay of a distribution tree included in a clock path, such as the clock path 124 of FIG. 1. The DQ model 204 may in turn delay the command signal WR_START_PDQ to provide a command signal WR_START_XCLK to the DQS input buffer model 206. The delay of the DQ model 204 may model a propagation delay of a data out multiplexer and data out driver, such as the data out multiplexer 142 and data output driver 108 of FIG. 1. In at least one embodiment, the command signal WR_START_XCLK may be substantially aligned with an edge (e.g., rising edge or falling edge) of the clock signal CLK.

The DQS input buffer model 206 may delay the command signal WR_START_XCLK to provide a command signal WR_START_IB to the DQS input distribution tree model 208. The delay of the DQS input buffer model 206 may model a propagation delay of a DQS input buffer, such as the DQS input buffer 110 of FIG. 1. The command signal WR_START_IB may be coupled to the DQS input distribution tree model 208, which may further delay WR_START_IB to provide the command signal WR_START. The delay of the DQS input distribution tree model 208 may model a propagation delay of a DQS distribution tree, such as the DQS input distribution tree 126 of FIG. 1.

Although the elements of the command path 200 are described as having a particular order, in other embodiments, the elements of the command path 200 may be arranged in any different order. For example, in one embodiment, the DQS input buffer model 206 may be coupled between the distribution tree 202 and the DQ model 204. The delays provided by one or more of the elements of the command path 200 may model any combination of propagation delays of elements of the apparatus 100 and/or the command path 200. Moreover, respective delays provided by elements of the command path 200 may be adjustable based on one or more respective control signals and/or process, voltage, and/or temperature (PVT) characteristics of the command path 200 and/or the apparatus 100.

Figure 3:
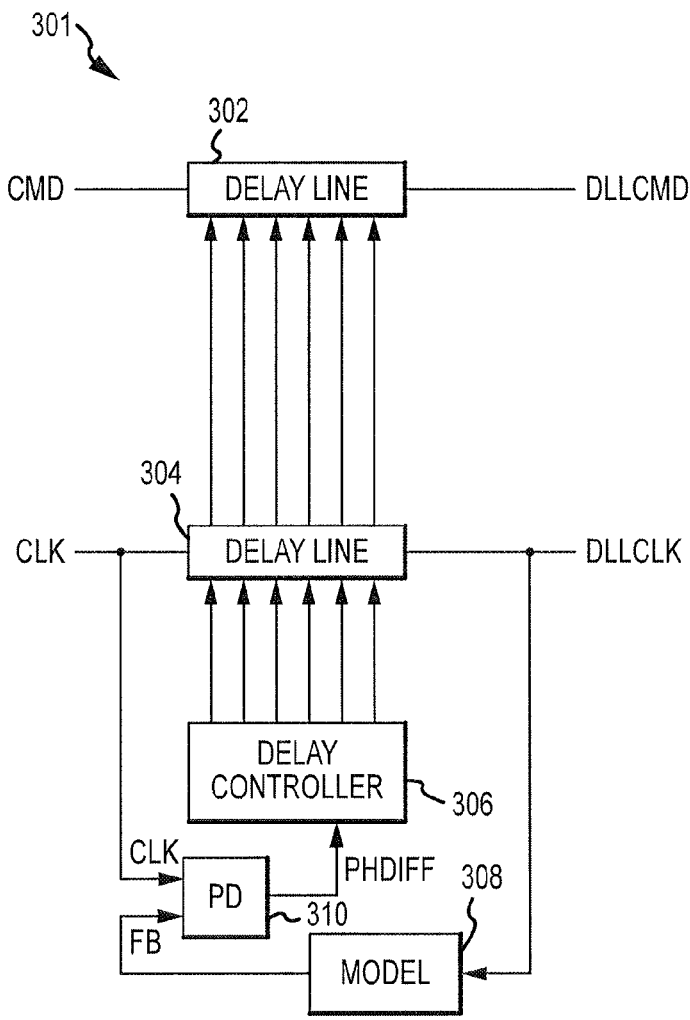
FIG. 3 is a block diagram of an adjustable delay circuit according to an embodiment of the invention.

FIG. 3 illustrates a block diagram of an adjustable delay circuit 300 according to an embodiment of the invention. The adjustable delay circuit 300 may be used to implement the adjustable delay circuit 120 of FIG. 1. The adjustable delay circuit 300 may include delay lines 302, 304, a delay controller 306, a model delay 308, and a phase detector 310.

The delay line 302 may be coupled to the delay controller 306 and may be configured to receive a buffered command signal CMD, for instance, from the input buffer 102 of FIG. 1. The delay line 302 may be configured to delay the command signal CMD and may do so in accordance with one or more control signals provided by the delay controller 306. The delay line 304 may be coupled to the delay controller 306 and may be configured to receive a buffered clock signal CLK, for instance, from the input buffer 104 of FIG. 1. The delay line 304 may be configured to delay the clock signal CLK to provide a clock signal DLLCLK and may do so in accordance with one or more control signals provided by the delay controller 306. In at least one embodiment, the delay lines 302, 304 may be configured to receive a same one or more control signals from the delay controller 306 and respectively delay the CMD and CLK signals a same amount.

The delay line 304 may provide the clock signal DLLCLK to the model delay 308. The model delay 308 may be configured to provide a delay that models a portion (or all) of one or more propagation delays described herein. In one embodiment, for instance, the model delay may provide a delay that models a portion (or all) of a propagation delay of an input buffer, such as the input buffer 104 of FIG. 1, and a propagation delay of a clock path, such as the clock path 124 of FIG. 1. A feedback signal FB having a delay relative to the clock signal DLLCLK, as provided by the delay of the model delay 308, may be provided to a phase detector 310. The phase detector 310 may also receive the clock signal CLK. The phase detector 310 may be configured to provide a signal PHDIFF to the delay controller 306 indicating a phase difference between the CLK and FB signals. The delay controller 306 may be configured to adjust the delay of the delay lines 302, 304 based, at least in part, on the PHDIFF signal. The delay of the delay lines 302, 304 may be adjusted until the CLK and FB signals are in phase.

Figure 4:
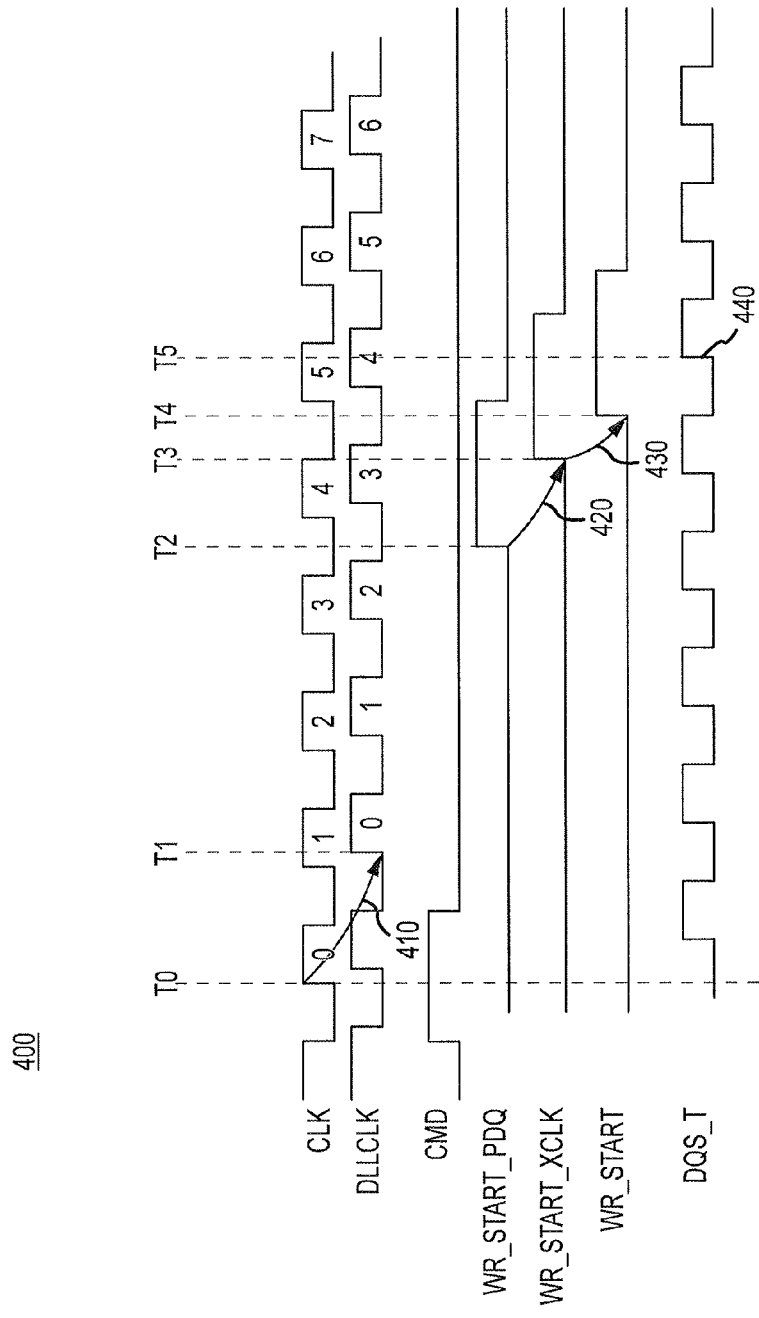
FIG. 4 is a timing diagram illustrating an example operation of the apparatus of FIG. 1 according to an embodiment of the invention.

FIG. 4 is a timing diagram 400 illustrating an example operation of the apparatus 100 according to an embodiment of the invention. It is assumed for the example that the command path 122 is implemented by the command path 200 of FIG. 2. The timing diagram 400 includes the clock signals CLK and DLLCLK; command signals CMD, WR_START_PDQ, WRSTART_XCLK, and WR_START; and strobe signal DQS_T. While the timing diagram 400 is directed to an example operation where the shifter 114 is configured to provide a delay of 5 clock cycles (recall this may be based on a programmable latency), it will be appreciated that a shifter 114 having a delay comprising any number of cycles may be used in accordance with embodiments of the present invention.

At a time T0, a clock cycle 0 of the clock signal CLK may be received by the apparatus 100, and in particular, by the input buffer 104. In addition, a command signal CMD may be received by the input buffer 102. The clock signal CLK and the command signal CMD may be provided to the adjustable delay circuit 120. At a time T1, a delayed clock cycle 0 of the clock signal CLK, or clock cycle 0 of the clock signal DLLCLK, may be provided from the adjustable delay circuit 120 to the shifter 114 and the clock path 124. In addition, the command signal CMD may be provided from the adjustable delay circuit 120 to the shifter 114. As previously described, the adjustable delay circuit 120 may be configured to delay the command signal CMD and the clock signal CLK, for instance, by a delay 410 based on the propagation delay of the forward clock path.

At a time T2, the delayed command signal CMD may be provided to the DQ model 204 as the command signal WR_START_PDQ. The DQ model 204 may delay the command signal WRSTART_PDQ by a delay 420 to provide a command signal WR_START_XCLK. At a time T3, WR_START_XCLK may be delayed by a delay 430 to provide a command signal WR_START at a time T4. The delay 430 may for instance, include delays modeled by both the DQS input buffer model 206 and the DQS input distribution tree model 208.

As discussed above, the data capture logic 140 may be configured to receive both the WR_START and DQS_T signals, and the WR_START signal may identify a first valid edge of the DQS_T signal. Thus, the WR_START signal may be provided to the data capture logic 140 at the time T4, and in response, the data capture logic 140 may recognize the next edge of the signal DQS_T, an edge 440, as a first valid edge at which to capture data provided by the data input buffer 106. In one embodiment, the WR_START signal may be received at a falling edge of the signal DQS_T, however, it will be appreciated that the signal WR_START may be received at any point relative to the DQS_T, such that the next edge may properly be identified as a next valid edge. Accordingly, at a time T5, the edge 440 of the DQS_T signal may be received by the data capture logic 140, and the data capture logic 140 may capture data in response. As described, data may be captured at each edge of the signal DQS_T until a WR_LAST (not shown) signal is generated by, or provided to, the data capture logic 140, or until a full burst has been captured by the data capture logic 140.

As explained, the timing diagram 400 is directed to an example operation having a delay of 5 clock cycles of the clock signal DLLCLK. Thus, as illustrated, the command signal WR_START may be received by the data capture logic 140 at a time T4 during the 5th cycle (clock cycle 4 ) of the clock signal CLK, and in response, the data capture logic 140 may begin capturing data during the 6th cycle (clock cycle 5 ) of the clock signal CLK. The 5 clock cycle delay between the time at which the command signal CMD is provided to the apparatus 100 and the time at which the data capture logic 140 begins capturing data may be based, at least in part, on the delay provided by the shifter 114.

Accordingly, various embodiments of the invention may delay the command signal WR_START such that it is properly aligned with DQS_T signal. In this manner, the data capture logic 140 may receive the aligned WR_START and DQS_T signals and determine the edges of the DQS_T signal at which data of a write burst should be captured and provided to an array thereafter, as described above.

Figure 5:
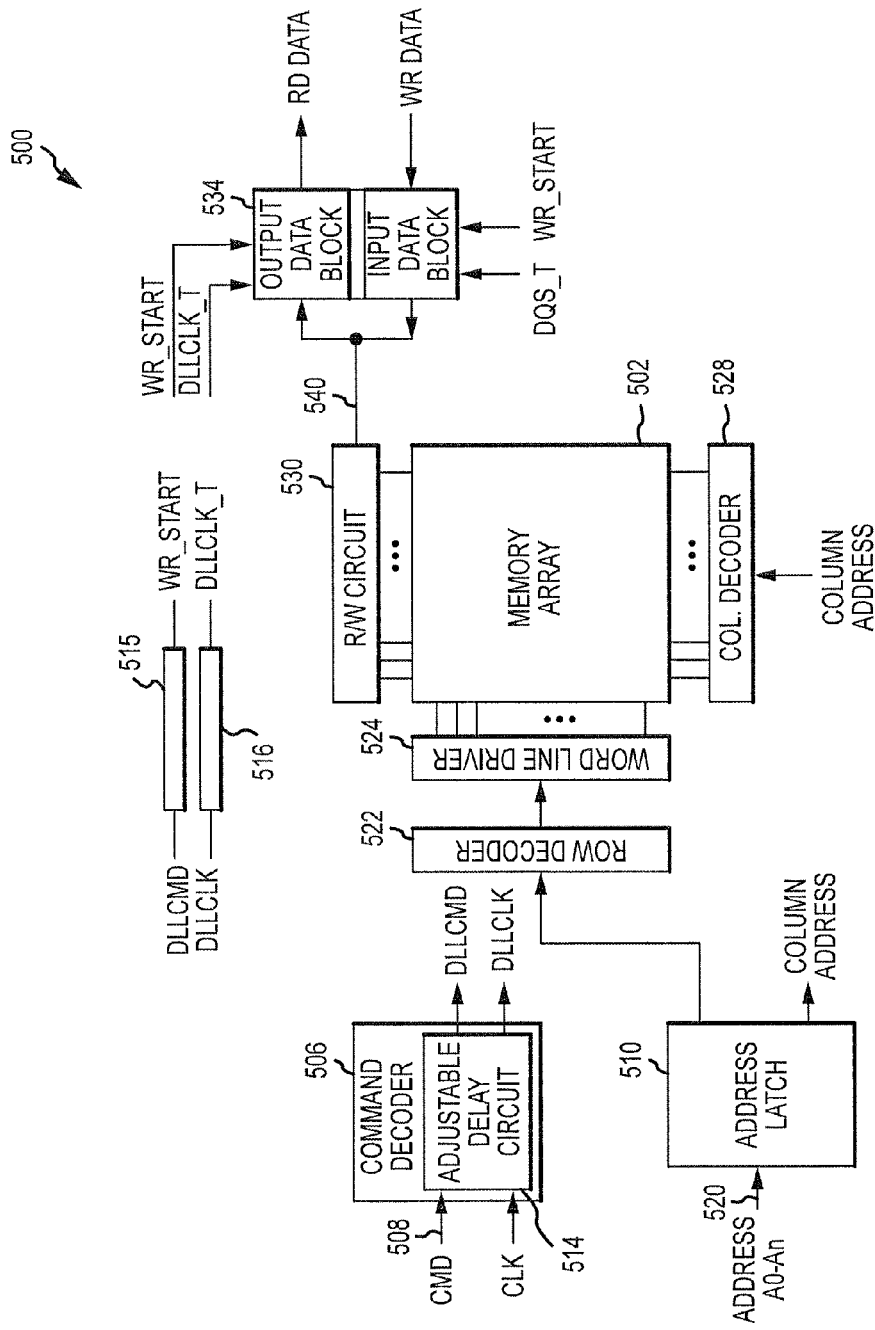
FIG. 5 is a block diagram of a portion of a memory including a command path according to an embodiment of the invention.

FIG. 5 illustrates a portion of a memory 500 according to an embodiment of the invention. The memory 500 may include an array 502 of memory cells, which may be, for example, DRAM memory cells, SRAM memory cells, flash memory cells, or one or more other types of memory cells. The memory 500 may include a command decoder 506 that receives memory commands through a command bus 508 and may provide corresponding control signals within the memory 500 to carry out various memory operations. Row and column address signals may be provided to the memory 500 through an address bus 520 and may be provided to an address latch 510. The address latch may then output a separate column address and a separate row address.

The row and column addresses may be provided by the address latch 510 to a row address decoder 522 and a column address decoder 528, respectively. The column address decoder 528 may select bit lines extending through the array 502 corresponding to respective column addresses. The row address decoder 522 may be connected to word line driver 524 that activates respective rows of memory cells in the array 502 corresponding to received row addresses. The selected data line (e.g., a bit line or bit lines) corresponding to a received column address may be coupled to a read/write circuitry 530 to provide read data to an input/output data block 502 through the I/O data block 534 and the memory array read/write circuitry 530. The I/O data block 534 may include clocked circuitry that operates responsive to an internal clock signal DLLCLK_T and an internal command signal WR_START, for example.

The memory 500 further includes adjustable delay circuit 514, command path 515, and a clock path 516. The adjustable delay circuit 514 may receive the signals CLK and CMD and provide the signals DLLCLK and DLLCMD in accordance with embodiments of the invention described herein. The command path 515 may receive the signal DLLCMD and provide a command signal WR_START based, at least in part, on the signal DLLCMD. The clock path 516 may receive the signal DLLCLK and provide a DLLCLK_T signal based, at least in part, on the DLLCLK signal.

While the adjustable delay circuit 514 is shown in FIG. 5 as being included in the command decoder 506, it will be appreciated that other configurations may be used. The adjustable delay circuit 514 may, for example, be stored outside of the command decoder 506. Moreover, the command decoder 506 may respond to memory commands provided to the command bus 508 to perform various operations on the memory array 502. In particular, the command decoder 506 may be used to provide internal control signals to read data from and write data to the memory array 502.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a command path configured to receive a command signal and delay the command signal based, at least in part, on a plurality of propagation delays, the plurality of propagation delays including a propagation delay of a data out multiplexer and a propagation delay of a data out driver;
a data capture logic coupled to the command path and configured to receive the delayed command signal and a data strobe signal, the data capture logic further configured to capture data according to the data strobe signal responsive, at least in part, to receipt of the delayed command signal.

2. The apparatus of claim 1, wherein the plurality of propagation delays further includes a propagation delay of a distribution tree, a DQS input buffer, a DQS input distribution tree, or a combination thereof.

3. The apparatus of claim 1, wherein the data capture logic is further configured to stop capturing data responsive, at least in part, to a control signal.

4. The apparatus of claim 1, wherein the control signal is generated by the data capture logic.

5. The apparatus of claim 1, wherein the apparatus is included in a memory.

6. The apparatus of claim 1, wherein the data capture logic is configured to capture data on rising edges and falling edges of the data strobe signal.

7. An apparatus, comprising:
an adjustable delay circuit configured to receive a first command signal and a clock signal, the adjustable delay circuit further configured to delay the first command signal and the clock signal by a same amount based, at least in part, on a delay of a delay model;
a command path configured to receive the delayed first command signal and delay the delayed command signal to provide a second command signal, the delay of the command path including a delay of a DQ model; and
a data capture logic coupled to the command path and configured to capture data from a DQ pad responsive, at least in part, to receipt of the second command signal and respective edges of a data strobe signal.

8. The apparatus of claim 7, further comprising:
a data out multiplexer configured to receive the delayed clock signal and provide data to the DQ pad according to the delayed clock signal.

9. The apparatus of claim 7, further comprising:
a shifter coupled to the adjustable delay circuit and the command path and configured to receive the delayed command signal and delay the delayed command signal by a number of cycles, the number of cycles based on a programmable latency of a memory array.

10. The apparatus of claim 7, wherein the delay of the command path further includes a propagation delay of a distribution tree, a DQS input buffer, a DQS input distribution tree, or a combination thereof.

11. The apparatus of claim 7, wherein the adjustable delay circuit comprises a delay locked loop.

12. The apparatus of claim 7, wherein the apparatus is included in a memory.

13. A method, comprising:
delaying a command signal with a command path based, at least in part, on a plurality of propagation delays to provide a delayed command signal to a data capture logic, wherein one of the plurality of propagation delays models a propagation delay of a data out multiplexer and a propagation delay of a data out driver; and capturing, using the data capture logic, data corresponding to the command signal according to a strobe signal and responsive, at least in part, to receipt of the delayed command signal.

14. The method of claim 13, further comprising:
delaying the command signal with an adjustable delay circuit based, at least in part, on a delay model.

15. The method of claim 14, wherein said delaying a command signal with a command path comprises:
delaying the command signal by a delay modeling a propagation delay of a distribution tree;
delaying the command signal by a delay modeling a propagation delay of a DQS input buffer; and
delaying the command signal by a delay modeling a propagation delay of a DQS input distribution tree.

16. The method of claim 14, wherein said capturing comprises:
capturing data on rising and falling edges of the strobe signal.

17. A method, comprising:
delaying a first command signal and a clock signal based, at least in part, on a delay of a delay model to provide a delayed first command signal and a delayed clock signal;
delaying the delayed first command signal based, at least in part, on a plurality of propagation delays to provide a second command signal, the plurality of propagation delays including a delay of a DQ model; and
capturing data responsive, at least in part, to receipt of the second command signal and respective edges of a data strobe signal.

18. The method of claim 17, wherein the plurality of propagation delays comprises a propagation delay of a distribution tree, a propagation delay of a data out multiplexer, a propagation delay of a data out driver, a propagation delay of a DQS input buffer, and a propagation delay of a DQS input distribution tree.

19. The method of claim 17, further comprising:
providing data from a data out multiplexer according to the delayed clock signal.

20. The method of claim 17, further comprising:
after said delaying a first command signal and a clock signal based, at least in part, on a delay of a delay model, delaying the first command signal by a number of cycles, the number of cycles based, at least in part, on a programmable latency.

21. A method, comprising:
receiving a clock signal and a command signal;
delaying the clock signal and the command signal by a same amount;
delaying the delayed command signal by one or more cycles of the delayed clock signal to provide a shifted command signal;
delaying the shifted command signal based, at least in part, on a propagation delay of a data output multiplexer and a propagation delay of a data out driver to provide a WR_START command signal; and
capturing data according to a data strobe signal responsive, at least in part, to receipt of the WR_START command signal.

22. The method of claim 21, wherein the one or more cycles of the delayed clock signal is based on a programmable latency.

23. The method of claim 21, further comprising:
delaying the WR_START command signal by a delay modeling a propagation delay of a distribution tree;
delaying the WR_START command signal by a delay modeling a propagation delay of a DQS input buffer; and
delaying the WR_START command signal by a delay modeling a propagation delay of a DQS input distribution tree.

* * * * *